US005574630A

United States Patent [19]
Kresge et al.

[11] Patent Number: 5,574,630
[45] Date of Patent: Nov. 12, 1996

[54] LAMINATED ELECTRONIC PACKAGE INCLUDING A POWER/GROUND ASSEMBLY

[75] Inventors: John S. Kresge, Binghamton, N.Y.; David N. Light, Friendsville, Pa.; Tien Y. Wu, Endwell, N.Y.

[73] Assignee: International Business Machines Corporation, Armonk, N.Y.

[21] Appl. No.: 438,952

[22] Filed: May 11, 1995

[51] Int. Cl.⁶ ............................................. H05K 7/14
[52] U.S. Cl. .................. 361/792; 174/255; 174/256; 174/257; 174/258; 174/260; 361/794; 361/795
[58] Field of Search ............................... 174/255, 256, 174/257, 258, 261, 262, 263; 156/628, 646, 656; 361/748, 784, 790, 792–795, 803; 428/137, 209, 212, 285, 408, 473.5, 901

[56] References Cited

U.S. PATENT DOCUMENTS

| | | | |
|---|---|---|---|
| 4,496,793 | 1/1985 | Hanson et al. | 174/256 |
| 4,654,248 | 3/1987 | Mohammed | 428/209 |
| 4,821,007 | 4/1989 | Fields et al. | |
| 4,933,045 | 6/1990 | DiStefano et al. | |
| 5,108,562 | 4/1992 | Duke et al. | |
| 5,126,016 | 6/1992 | Glenning et al. | |
| 5,153,986 | 10/1992 | Brauer et al. | |
| 5,192,581 | 3/1993 | Hirsch et al. | |
| 5,280,414 | 1/1994 | Davis et al. | |
| 5,396,034 | 3/1995 | Fujita et al. | 174/261 |
| 5,442,144 | 8/1995 | Chen et al. | 174/266 |
| 5,483,421 | 1/1996 | Gedney et al. | 361/771 |

OTHER PUBLICATIONS

IBM Technical Disclosure Bulletin "Control Of Thermal Coefficient Of Expansion Of Substrate Materials" by Dougherty vol. 19 No. 8 Jan. 1977.

Primary Examiner—Donald A. Sparks
Attorney, Agent, or Firm—Calfee, Halter & Griswold

[57] ABSTRACT

A power/ground structure and associated circuit card or board are provided in which the coefficient of thermal expansion of the power/ground structure and associated circuit board are closely matched to each other. The circuit board or card is formed of organic electrically-insulating material having electrical circuitry thereon which carries an integrated circuit chip. The power/ground assembly is formed of alternating layers of organic insulating material and at least two layers of electrically-conducting material, typically copper, one of the layers of electrically-conducting material forming a power connection and another layer of the electrically-conducting material forming a ground plane. There is also at least one additional layer of a structural material having a relatively high Young's Modulus and a CTE of less than about 10 PPM/°C. Invar or copper clad Invar are preferred materials for this structure. The electrically-conducting copper material and the Invar are selected in thickness and number such that, together with the electrically-insulating material, the composite CTE of the power/ground structure closely matches that of the circuit card or board.

12 Claims, 4 Drawing Sheets

LAMINATED ELECTRONIC PACKAGE INCLUDING A POWER/GROUND ASSEMBLY

FIELD OF THE INVENTION

This invention relates generally to electronic packaging structures whose coefficient of thermal expansion needs to be tailored to minimize strain at joining interfaces to other electronic packaging structures mounted on the first structure, and more particularly to structures for providing power/ground distribution to circuit boards or carriers which mount I/C chip carriers or I/C chips directly. It also relates to a method of manufacture thereof which controls the coefficient of thermal expansion of the electronic packaging structure to be compatible with that of other packaging structures mounted to the surface of the first structure.

BACKGROUND INFORMATION

The reliability and performance of high performance circuit packages can be enhanced by matching the coefficient of thermal expansion (CTE) of the base carrier (circuit board, chip carrier, etc.) to the components to be mounted.

The primary drivers for this are large solder ball grid array (BGA) interconnects, and other soldered interfaces. As chip I/O increases beyond the capability of peripheral lead devices, area array interconnects such as the BGA are the preferred method for making large numbers of connections between chip carriers and cards/boards. If the CTE of the chip carrier does not match the card, as is the case with an epoxy-glass card and ceramic chip carrier, then the size of the BGA will be limited due to strain-induced fatigue of the solder joints during thermal cycling.

As module size increases beyond fatigue limits for solder ball attach, current practice dictates the use of a separate connector system to relieve the CTE mismatch between the two packages. Typical connectors include flex cables or sockets. This hardware adds cost and limits performance due to increased noise and power distribution inductance. If the package CTEs are matched by restraining the expansion of the card/board, then very large chip carriers can be reliably assembled directly to a circuit board using soldered BGA. This provides the large number of interconnects required for high performance single-chip and multi-chip carriers and eliminates the cost and performance penalty of a connector system.

When a large number of chip carriers or chips are assembled to a card/board, the average power and instantaneous current demand become quite high. It is desirable under these circumstances to separate the signal and power distribution function within the card/board so that each can be optimized to its particular function. To accomplish this, a separate laminated power structure (LPS) can be fabricated using very thick copper planes and attached to a card or board optimized for signal interconnects. Power is transferred from the LPS to the card or board through a large number of vias which pass from the LPS, through the card, to the BGA's on the card or board surface. It is further desirable to eliminate any intermediate connector system between the LPS and card/module. This reduces the overall inductance of the power distribution system and allows for higher simultaneous driver switching and/or faster drivers. A soldered or metallurgical interconnection provides the lowest inductance interface, and eliminates the cost of an LPS to card/module connector.

If the card/board is CTE controlled, or of a material set yielding a CTE different from the LPS, then the LPS must be CTE matched to the card to allow this direct soldered attachment. In this way, the need for CTE matching propagates through the package to all levels involved in large area soldered interconnects, and can in fact begin at the chip carrier if the chip assembly technique requires a CTE match between the chip and the chip carrier. So in the full implication, CTE control or matching can be used in the chip carrier, the card and the LPS or in any combination.

Current practice for CTE control in laminate structures involves replacing copper power layers with copper clad Invar (CIC) or other low expansion metals. The Invar alloy used in this cladding has near zero CTE and will compensate/reduce the CTE of the overall laminate structure. The amount of CTE reduction will depend on the ratio of Invar to copper in the overall structure, and the compliance and CTE of the insulation layers used in the laminate.

Due to the presence of iron alloy, Invar (and CIC) is difficult to machine even in thin layers, and requires special techniques to enable the mechanical drilling of power vias. In an LPS application, heavy power planes with low resistivity are required. 10–100 oz. of copper might be required in a typical LPS. Significantly more material would be needed if CIC were used as the power plane material. This is because at equivalent thickness, the copper content would be reduced; and compared to copper, Invar is a poor conductor. The large thickness of Invar in this type of structure makes mechanical drilling of the power vias impractical.

One technique for forming the expansion controlled card or carrier is to utilize alternating layers of dielectric material, copper, and very thin layers of an electrically conducting, expansion stabilizing material such as a laminate of copper/Invar®/copper ("CIC"). One type of high performance insulating material is silica filled polytetrafluoroethylene (PTFE), with the carrier being formed of alternating laminae of CIC, copper, and filled PTFE. Similar types of carriers can be formed using polyimides or glass filled epoxy known as FR4 as the dielectric material.

The structures can be made by conventional processing techniques, which include a step of drilling signal vias through the carrier from the top surface to intersect various signal planes, power vias through the carrier from the top surface to intersect various power planes, and reference (ground) vias through the carrier from the top surface to intersect various reference planes. The drilled vias are filled with a conducting material, such as plated copper, and the necessary wiring geometry is provided on the surface of the board by conventional photolithographic or silk screening techniques. The chip is then connected either directly or through a ceramic or other dielectric interposer to the surface of the board by means such as solder ball connections. Alternatively to standard plated through hole techniques, parallel processing utilizing layer-to-layer joining techniques can be employed to build the board structure.

The CIC planes are of relatively thin cross-section, i.e., of the order of magnitude of 1 mil. The 1 mil thick CIC can be drilled, with appropriate engineering practices, and hence it is commercially feasible to use the CIC both as a structural member as well as a power or ground plane, since the conductivity and structural properties such as CTE are well combined in the CIC structure.

A typical structure formed of laminae of copper, CIC, and the silica-filled PTFE has a composite coefficient of thermal expansion of about 7–10 ppm/C. This compares to about 6–8 ppm/C for ceramics which are frequently used to mount silicon chips, and also compares to 2–3 ppm/C for silicon chips, thus giving a coefficient of thermal expansion of the copper, CIC and silica-filled PTFE laminate which is relatively well matched to the CTEs of both ceramic and silicon. The difference in CTE between hierarchical structures in an electronic packaging assembly is one key factor determining the stress at the interface between these attached structures during thermal cycling. A second key factor is Young's Modulus. A lower modulus (higher compliancy) reduces stress at the interface. Silica-filled PTFE is particularly well suited to hierarchical packaging assemblies due to its relatively low modulus (approx. 150 kpsi).

In order to provide sufficient power and ground to the integrated circuit chip, it is at times necessary to provide a supplemental power/ground structure, having heavy copper planes and vias, connected electrically and mechanically to the board or card on which the chip or chip carrier is attached. It is further necessary that the stress induced at the interface between this supplemental power/ground assembly and the adjacent circuit card or board which is mounted on it be controlled at sufficiently low levels through thermal cycling such that strain-induced malfunctions do not occur. The use of a power/ground structure having CIC or Invar layers laminated alternately with copper in PTFE or other insulator materials could be engineered or tailored to have a similar CTE as the circuit card or board, which in turn have been engineered to be well matched in CTE to each other and to the chip. However, this would typically require relatively thick CIC or Invar layers in the power/ground assembly, in order to compensate for the thick copper power and ground plane layers with relatively high CTE (17 ppm/C). Layers of CIC this thick are extremely difficult to drill and hence not commercially satisfactory for forming such a power/ground structure. Thus, there exists a need for a power/ground structure having a CTE closely matched to that of the card or board and which can be readily manufactured to provide the necessary power/ground distribution and interconnections while minimizing failures due to thermal cycling.

SUMMARY OF THE INVENTION

According to the present invention, a power/ground structure and associated circuit card or board and method of manufacturing the same are provided. The card or board is formed of organic electrically insulating material having opposed, spaced faces. Electrical circuitry including chip or chip carrier mounting sites is provided on one face of the circuit board or card, and electrical connection sites are provided on the other face to provide power and ground connections to the circuit board or card, and which, through vias or plated through holes in the circuit board or card, in turn provide power and ground to the chip carrier or chips. The CTEs of the board or card and power/ground structure are controlled to given known values.

The power/ground assembly is formed of alternating layers of organic insulating material and at least two layers of electrically-conducting material (typically copper), one of the layers of electrical conducting material forming a power supply connection, and another layer of electrical conducting material forming a ground plane connection, and at least one layer of structural material having a relatively high Young's Modulus and a CTE of less than about 10 ppm/°C. Nickel iron alloys having nominally 36% nickel are well suited for this, as is molybdenum. Invar® is a preferred material for this which can be a sheet of Invar® or a laminate of copper-Invar-copper (CIC) layers. Invar® is a nickel iron alloy containing about 36% nickel, 63% iron and up to 1% of other metals.

The power/ground assembly has a mounting surface defined by the exposed face of one of the layers of the organic insulating material, which has formed thereon power connection sites and ground connection sites. A number of vias or plated holes extend from the power connection sites on the mounting face to the layer of electrically-conducting material defining the power supply and another number of vias or plated holes extend from the ground connection sites on the mounting face to the conducting material defining the ground plane. At least one of the layers of the electrically-conducting material forming the ground planes or the power planes and at least one layer of the structural material has clearance openings therethrough through which at least some of the vias or plated holes extend without physical contact. The ground planes and power planes are connected to external power/ground connections such as power connections, bus bars, etc.

The layers of material defining the power/ground assembly are selected in thickness such that the overall CTE of the power ground assembly is substantially the same as the value of the CTE of the circuit card or board. The card or board and the power/ground assembly are electrically and physically interconnected at their adjacent faces to provide a unitary physical structure that provides electrical power and ground from the power/ground assembly to the card or board. Preferably the connection between the card or board and the power/ground assembly is by means of metallurgic bonding which provides both the desired mechanical and electrical interconnection between the card or board and the power/ground assembly. Connection to the signal planes on the card or board are provided, preferably by flexible cable at the edges of the card or board. However, other types of interconnection, such as solder balls, can be utilized. Indeed, the card or board and power/ground assemblies can be formed of two sections of a single laminated structure.

An integrated circuit chip can be mounted on the face of the card or board either directly or through an interposer, sometimes referred to as a chip carrier, to form a single or multi-chip module by means of any type of suitable connection. Normally, these connections are solder ball connections or wire bond connections.

DESCRIPTION OF THE PREFERRED EMBODIMENT

Figure 1:
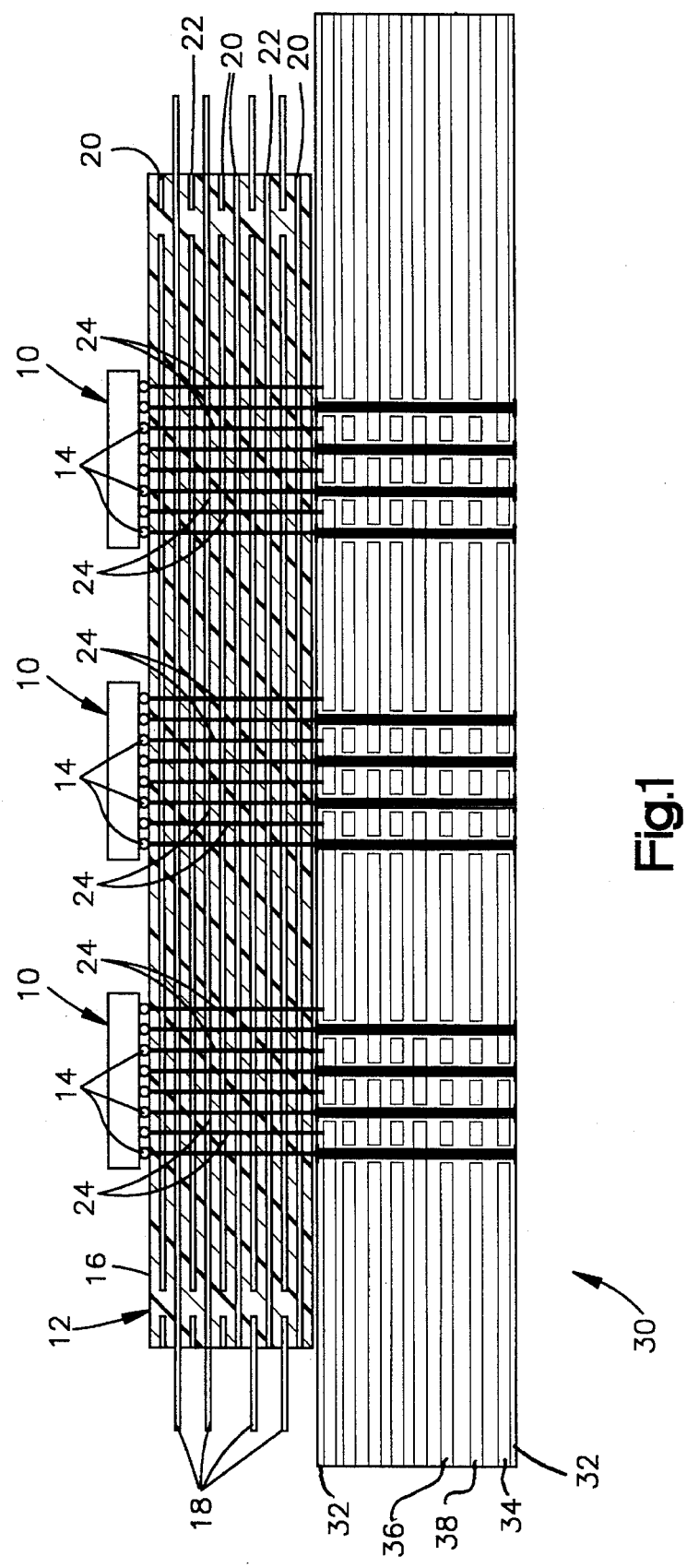
FIG. 1 is a sectional view somewhat diagrammatic showing integrated circuit chips mounted on a card which in turn is mounted on a power/ground assembly.

Before turning to the drawings specifically an overview of the invention is provided to help in understanding the detailed description which follows. In the field of computers, a very conventional technique of providing the electronics and logic for the computer is by use of printed circuit boards or cards which have various components mounted thereon. These components include not only capacitors, resistors and other passive components, but also integrated circuit (I/C) chips which perform various functions in a well known manner. These chips are mounted onto the circuit board or card either by direct chip attach or by the use of an interposer such as a ceramic substrate and form a single or multi-chip module. The I/C chip is mounted on the interposer by wire bonding or solder ball techniques or other well known techniques. The interposer with the chip thereon in turn is mounted on the circuit board. With increased power requirements, the circuit board often takes the form of a laminate having signal planes, as well as power and ground vias and planes, and on which the module is mounted. This circuit board or card in turn may be secured to a power/ground structure to provide supplemental power and ground planes. (This structure may constitute the entire complete circuit board, or it may be secured to an underlying board.) One of the concerns in selecting the materials for the construction of the card or board is that the final composite card or board structure have a coefficient of thermal expansion (CTE) sufficiently close to that of the interposer or module when one is used, or to the chip when an interposer or module is not used, so as to minimize the chance of cracking due to thermal stress or other types of failures due to thermal mismatch created during thermal cycling. Several factors enter into the selection of materials. One factor is the size of the chip or substrate carrying the chip that is mounted on the carrier. The smaller the size of the chip or interposer mounted to the carrier, the greater the thermal mismatch that can be tolerated. Another factor is the compliancy of the carrier material. PTFE is very compliant, and therefore most tolerant of thermal mismatch. Polyimide is less complaint and less tolerant of thermal mismatch, and FR4 glass-filled epoxy is least complaint and thus least tolerant of thermal mismatch. To this end, one type of card or board that has been developed is one using silica-filled polytetrafluoroethylene (PTFE) material. Conductive sheets of copper and copper-Invar®-copper are laminated in the PTFE to provide the necessary signal and power and ground planes. The exact structure and thicknesses of the copper-Invar-copper (CIC) and copper layers are selected such that they, in combination with the silica-filled PTFE, provide a close enough match (typically 7–10 ppm/°C.) to the CTE of the integrated circuit chip substrate, i.e., about 6–8 ppm/°C. for ceramic. Even if the chip is to be attached directly, the match is close enough to that of silicon, i.e. about 3–5 ppm/°C. to permit such attachment without undue risk of damage because of the compliancy of the PTFE and the relatively small size of the chip. The copper of the CIC provides fairly good electrical conductivity and the Invar® together with the copper provides the very low CTE to give the resultant composite CTE of 7–10 ppm/°C. to the carrier, depending on the ratio of copper to CIC in the structure. These sheets of CIC are quite thin, typically about 1 mil to 2 mils thick. Vias extend through the circuit board or card intersecting the planes to provide the necessary signal power and ground connections to the chip. If there is a supplemental power/ground assembly bonded to the circuit board or card, the power and ground planes in the circuit board or card can be relatively thin (e.g. 1–2 mils). With thin sheets of the size necessary for providing ground and power planes without such an assembly, it is commercially feasible to mechanically drill through the CIC to provide the necessary clearance holes or via interconnections. However, it is not commercially feasible to drill CIC sheets thicker than about 5 mils.

A laminated power/ground assembly is used and provides the necessary power and ground distribution to the circuit board or card. The laminated power/ground assembly should have a coefficient of thermal expansion close to that of the circuit board or card. Where power requirements are high, power and ground planes must contain a substantial thickness of copper (typically 2–5 mils or more) and must be substantially thicker than the conducting material used in the card or board. However, CIC sheets of material providing this thickness of copper would be substantially thicker (e.g., 10–20 mils) so that it is not commercially feasible to mechanically drill these layers by conventional techniques, therefore making the technique impractical for making power/ground assemblies with the PTFE technology of the card or board. To overcome this problem, the power/ground assembly is formed by utilizing PTFE material with relatively thick copper sheets as power and ground planes to provide the necessary conduction; but in addition to the relatively thick copper ground and power planes a group of low CTE, high Young's Modulus structural sheets are provided which also are relatively thick and preferably composed either of Invar® or copper clad Invar® (CIC) material or other low CTE, high modulus material such as molybdenum, which sheets do not perform a current carrying function, but merely perform a structural function and modify the CTE of the finished structure. These structural planes are predrilled, preferably by chemical etching, to have openings therein through which vias or plated through holes can pass without contacting the structural member. With this brief outline in mind, a better understanding can be had by referring to the following embodiments as depicted in FIGS. 1 through 9.

Referring now to the drawings and for the present FIG. 1, a plurality of integrated circuit chips 10 are shown which preferably are made of silicon (although Gallium Arsenide chips can also be used), and which chips are mounted directly on a circuit board or card 12 by solder balls 14. Of course, the chip 10 could be and frequently is mounted on a ceramic or other interface substrate to form a single or multi-chip module which in turn is mounted on the circuit board or card 12. Such a mounting of the substrate on the card or board 12 can be by solder ball or pin-in-hole or otherwise. The chip can be mounted on the substrate by solder balls, or TAB, or wire bonding or other known means. The card or board 12 can be a commercial silica-filled PTFE (such as RO2800 manufactured by Rogers Corp.) structure 16 which has laminated therein sheets of material 18 which form signal planes and sheets of material 20 which form power planes and sheets of material 22 which form ground planes. The sheets of material 18 which form the signal planes are copper or copper alloy. The sheets of material 20 which form the power planes are formed of copper, but can be formed of CIC, and the sheets of metal 22 which form the ground plane are typically formed of CIC about 1 mil to 2 mils thick. The CIC may be 12.5-75-12.5 or 25-50-25 CIC (i.e., the relative thickness of copper-Invar®-copper: 12.5-75-12.5 or 25-50-25). Other material is also useful, such as copper clad on only one surface of the Invar® or other thickness ratios. These sheets are conventional and well known in the art, as is the structure of the circuit board or card 12. The Invar® segment of each sheet has essentially a 0 CTE from about 20° C. to about 120° C. It is also possible in some instances to form the power and ground planes from copper. The signal planes 18 can extend from the side of the card or board 12 to external signal connections (not shown) as with flexible cables, or can be interconnected vertically, as with solder ball connections.

Vias 24 extend from the solder ball connections 14 through the circuit board or card 12 to the opposite surface 26 thereof wherein they terminate in pads 28 (FIG. 8) which are adapted to be connected to a power/ground assembly 30. (This assembly 30 is sometimes referred to as a power core or a laminated power structure.) The vias 24 are utilized to provide the necessary power and ground or several levels of power by the vias 24 to the solder ball connections 14 and thus provide power and ground voltages to operate the chip 10. Some vias 24 provide signal interconnection for the chip. The power planes 20 and 24 provide for uniform voltage levels to their respective connection to the solder balls 14. Vias are also provided for interconnection between the various signal planes on the structure. As indicated above, the necessary signals can be supplied through the signal planes 18 from the sides thereof. Alternatively, the signal distribution can be provided through interconnection on the back side of the structure similar to the power and ground connections.

The resultant or composite coefficient of thermal expansion of the circuit board or card 12 is dependent both upon the coefficient of thermal expansion of the silica-filled PTFE 16 and the coefficient of thermal expansion of the various conducting material sheets 18, 20 and 22. Conventionally, the thicknesses and the number of planes are selected such that the coefficient of thermal expansion of the carrier is about 7 to 10 ppm/°C. In the case of PTFE carriers, this provides a satisfactory match with the coefficient of thermal expansion of the I/C chip 10 which in the case of a silicon chip has a CTE of about 2–3 ppm/°C. since PTFE is quite compliant and also to a ceramic if a module using a ceramic substrate is used.

The power/ground assembly 30 preferably also is formed from silica-filled PTFE sheets 32 laminated with sheets of conducting material 34 to form power planes, sheets of material 36 to form ground planes and structural numbers 38 to control the CTE of the power/ground assembly. As can be seen in FIGS. 2-9, the power planes 34 have clearance openings 42 formed therein; the ground plane sheets 36 have clearance openings 44 therein; and the structural members 38 have clearance openings 46 therein. All of the openings 42, 44 and 46 allow vias to pass through the respective materials without engaging them where contact is not desired. The power and ground planes 34 and 36 are formed of a highly conductive material such as sheets of copper which are sufficiently thick to provide the necessary current carrying capacity to all of the connections on the chips requiring voltage and ground. The power planes 34 are at different voltage levels if different levels of voltage are required for operating the chip. The structural members 38 do not perform any current carrying function, these being specifically for the purpose of controlling the coefficient of thermal expansion of the power/ground assembly 30 so that it closely matches the coefficient of thermal expansion of the card or board 12. To this end, the structural members 38 are formed of a very low CTE material, such as Invar® which has close to 0 ppm/°C. CTE in the range of 20° to 120° C. and which has a high Young's Modulus, i.e. above about 25M PSI. Alternatively, CIC structural members can be used. In this case, the copper is not performing a current carrying function, but merely acting to provide the desired CTE of the structural member so that the final resulting structure of the power/ground assembly has the CTE in the range of 7 to 10 ppm/°C. matching that of the circuit board or card 12. Other material having a low CTE, i.e. below about 7–10 ppm/°C., and high Young's Modulus may be used, such as a molybdenum, tungsten, etc.

Figure 2:
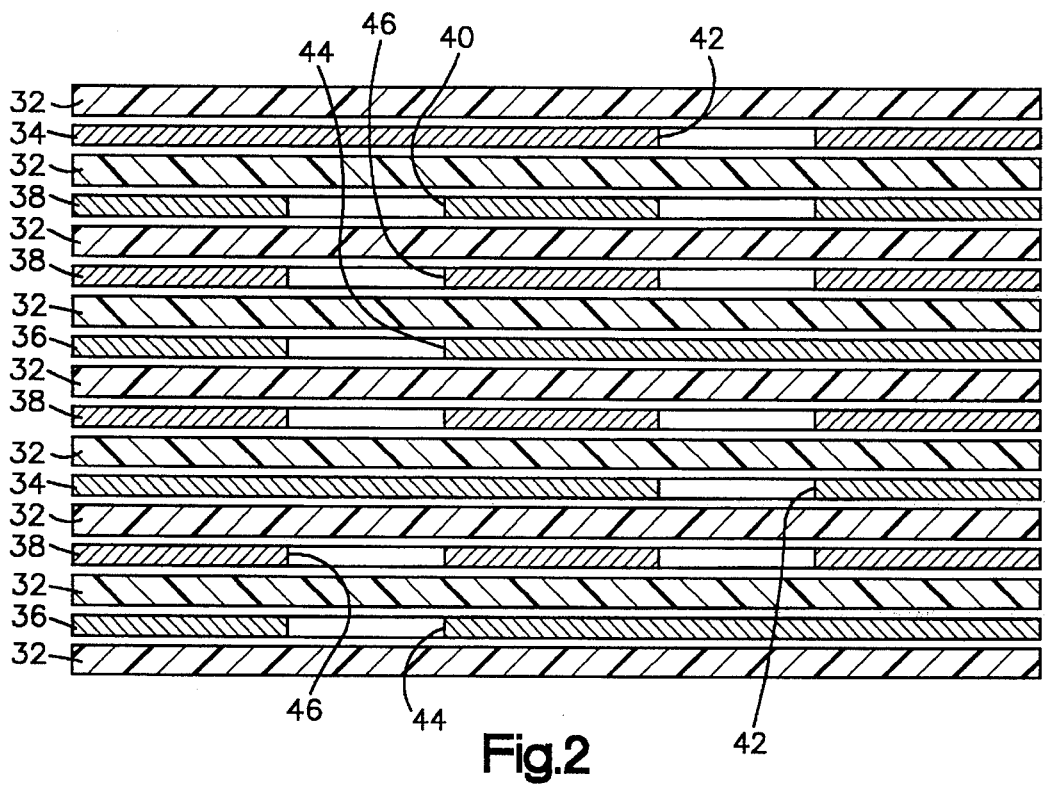
FIG. 2 is a sectional exploded view of the components of a power/ground assembly ready to be assembled and laminated.

As shown in FIG. 2, the power structure 30 is formed of alternating sheets of material which include sheets 32 of silica-filled PTFE, such as RO2800, copper sheets 34 to form power planes, copper sheets 36 to form ground planes and sheets of structural material 38 to contribute to the necessary CTE of the final product. The sheets of material are 34, 36 and 38 have predrilled clearance holes therein located where the vias are to pass through without contacting these sheets of material. To this end, all of the vias pass through all of the structural members 38 so all of the members 38 have holes formed therein wherein the vias are to pass through. In the case of the power planes 34 and ground planes 36, some of the vias are to contact some of these planes so as to provide the necessary power interconnection between the card or board and a power source or supply. Hence, wherever connections are to be formed, the sheets 34 and 36 are provided without openings therein. The connective openings are to be formed later as will be described.

The openings 42 and 44 can be drilled either mechanically or by chemical drilling. The holes or the openings 46 in the structural sheets 38 are preferably formed by a chemical etching using photoresist techniques, since it is very difficult to mechanically drill Invar®. Conventional etchants can be used to etch the Invar®. Etchants such as Cu Cl$_2$/HCL can be used to etch both the copper and Invar®. Also, the Invar® can be etched according to the teaching in application Ser. No. 08/359,218, filed Dec. 19, 1994. When the desired openings 42, 44 and 46 have all been formed, the sheets of PTFE 32 and the sheets 34, 36 and 38 are superimposed as shown in FIG. 2 and are laminated to form a unitary structure by application of heat and pressure in a well known manner, thus encapsulating or laminating therein the sheets 34, 36 and 38.

Figure 3:
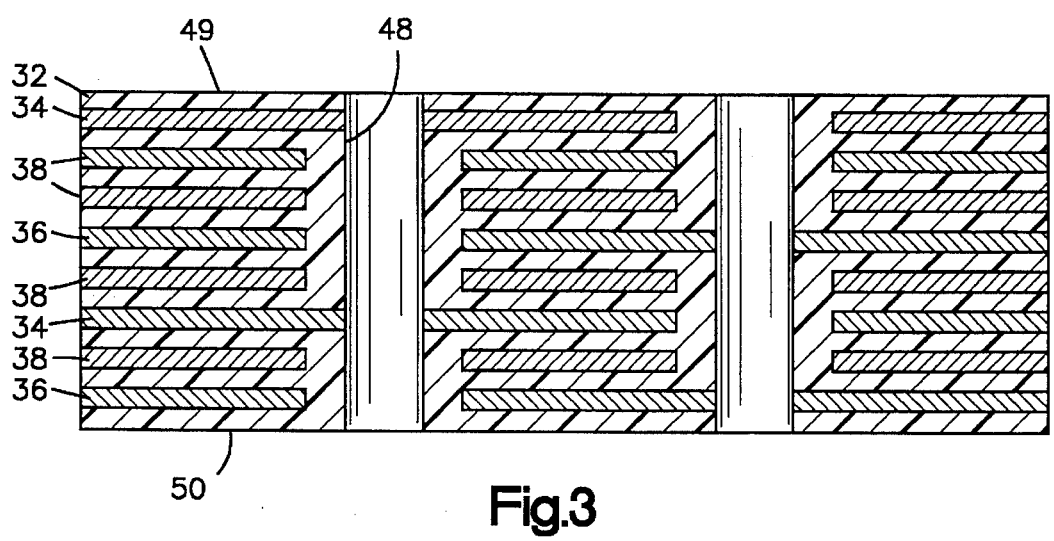
FIG. 3 is a sectional view of the component of a power/ground assembly laminated and having through holes drilled therein.
Figure 4:
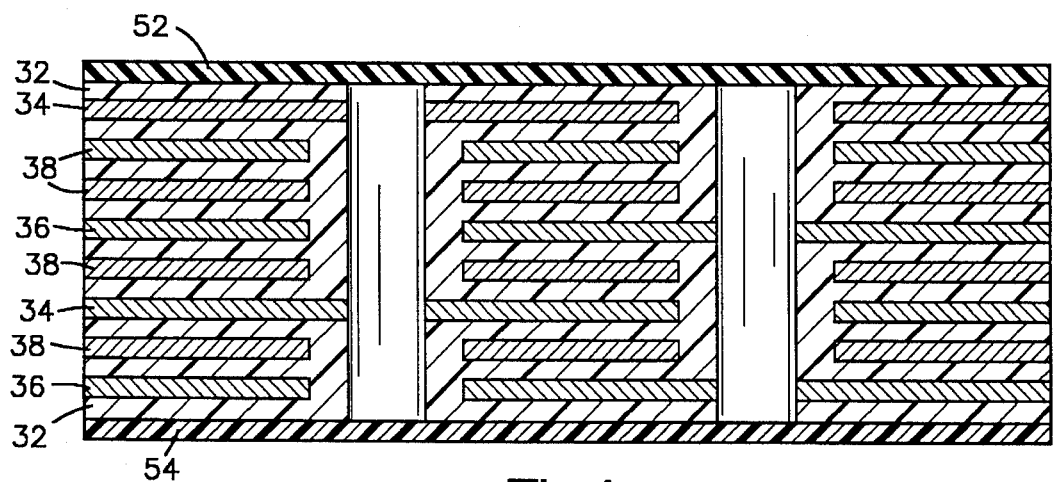
FIG. 4 is a view similar to FIG. 3 showing the power/ground assembly having photoresist thereon ready for circuitization.

Thereafter, holes 48 are drilled from the top surface 49 of the power/ground assembly 40 to the bottom surface 50 as shown in FIG. 3. At this point, the structure is ready to be metalized.

Figure 5:
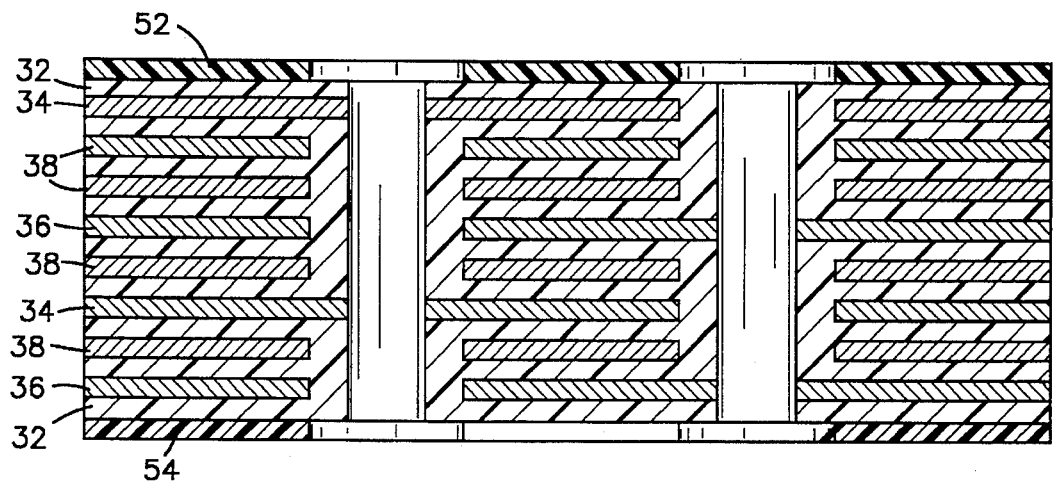
FIG. 5 is a view of the exposed and developed photoresist of a device of FIG. 4.
Figure 6:
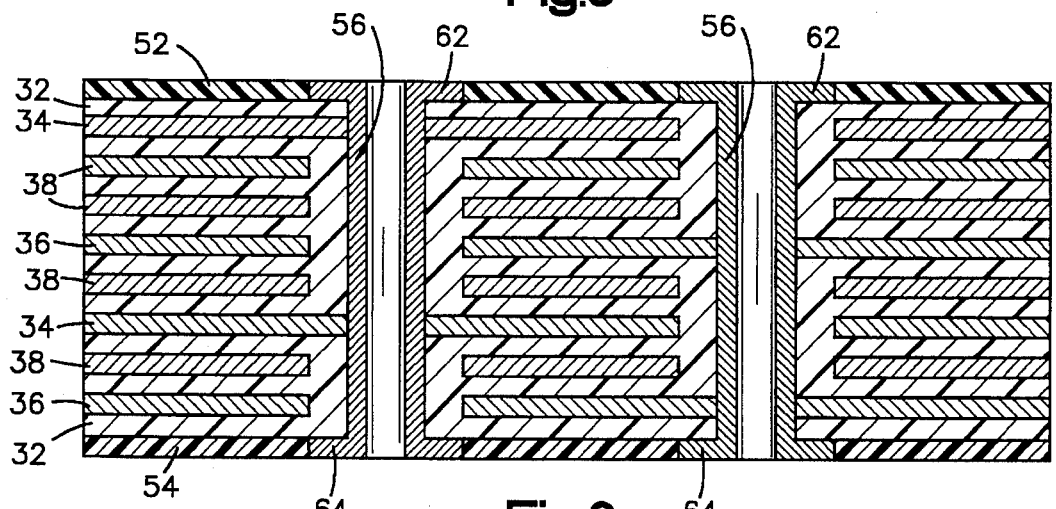
FIG. 6 is a view of the sectional view of circuitized power/ground assembly with the photoresist still in place.
Figure 7:
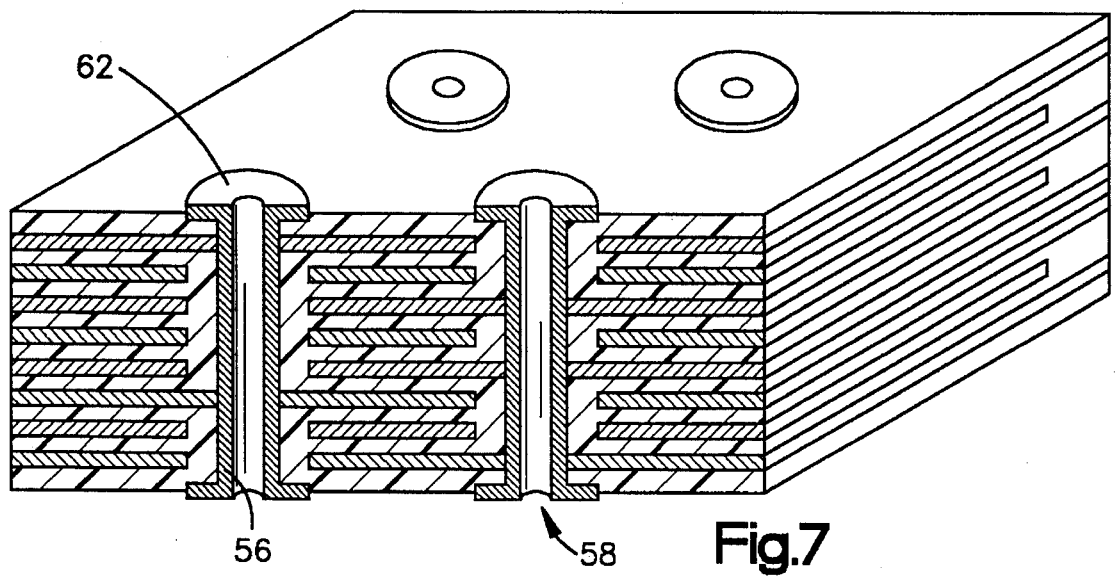
FIG. 7 is a perspective view partially in section of the device of FIG. 6 showing the power/ground assembly with pads thereon.

Metalization is performed utilizing photoresist processes. Conventional resists, such as dupont 4715 can be used, although any others will also work. Standard photoresist techniques are used to expose and develop the photoresist where plated through holes are to be formed and also reveal any other areas on the top surface 49 and bottom surface 50 of the power/ground assembly where metalization is to be provided as shown in FIG. 5. Following this metalization of the through holes and top surface metallizing is performed by additive plating. In the case of additive plating, necessary seeding is applied to the structure prior to application of the photoresist plating. The plating will form metalization 56 in the hole 48, as well as the top surface metalization 62 and bottom surface metalization 64. The top surface metalization 62 includes pads 62 for joining to the circuit board or card 12. The bottom surface metalization 60 includes pads for attachment to the required power and ground sources.

Figure 8:
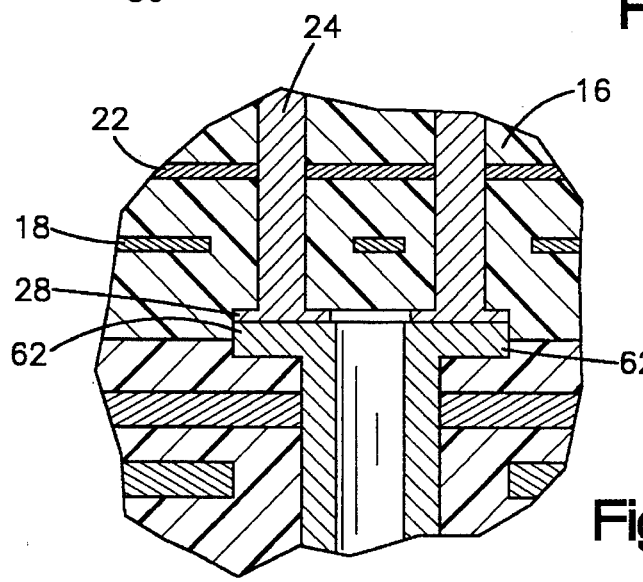
FIG. 8 is a detailed sectional view of one embodiment of a mounting of the card to the power/ground assembly.

The circuit board or card 12 is joined to the power/ground assembly 30 as shown in FIGS. 1 and 8. The joining can take place utilizing several different techniques, the preferred technique being by metallurgical bonding such as thermal solder or by the use of transient liquid phase bonding (TLPB) which is shown in U.S. Pat. No. 5,280,414. In such a joining process, pads 28 on the bottom surface of the circuit board or card 12 connect the power and ground planes of the circuit board or card 12 and are bonded to the respective tabs on the top surface metalization 60 for the power and ground planes of the power/ground assembly 30. In such techniques, a metal is interposed between the pads to be joined, and through application of heat and pressure, a bond is created. The PTFE of the carrier can also bond to the PTFE of the power/ground assembly during this process. Other bonding techniques could be used such as, for example, solder ball connections or the like. The resulting bond is shown in FIG. 8.

With the connection made, the relatively thick power and ground planes 34 and 36 of the power/ground assembly 30 supply the necessary power to the power planes 20 and ground planes 22 of the card or board while the structural members 38 provide the necessary structural support and control the overall coefficient of thermal expansion of the power/ground assembly 30 to match that of the circuit board or card 12.

Other materials and other fabrication techniques could be used. For example, the circuit board or card 12 or the power/ground assembly 30 can be made by joining several laminated structures, each having the required ground, power and required signal planes. Alternatively, the circuit board or card 12 and power/ground assembly 30 can be formed as a unitary structure by a single laminating operation in which the card or board 12 constitutes one section and the power/ground plane 30 another.

Also, as indicated above, dielectric materials other than PTFE can be used. For example, polyimides, such as Kapton® sold by dupont, may be used, or epoxy impregnated fiberglass known as FR4 may also be used either for the circuit board or card 12 or power/ground assembly 30. Moreover, the same material need not be used for the power/ground assembly 30 as for the circuit board or card 12. For example, the circuit board or card 12 could be formed of silica-filled PTFE and the power/ground assembly formed of either polyimide or FR4 material. It should be noted, however, that PTFE is more compliant than polyimides, and polyimides more compliant than FR4; and the less compliant the material, the more critical the match of the CTEs of the carrier and power/ground assembly. Expressed another way, a closer match of the CTEs is required for the less compliant materials, whereas more leeway is permitted with more compliant materials.

Figure 9:
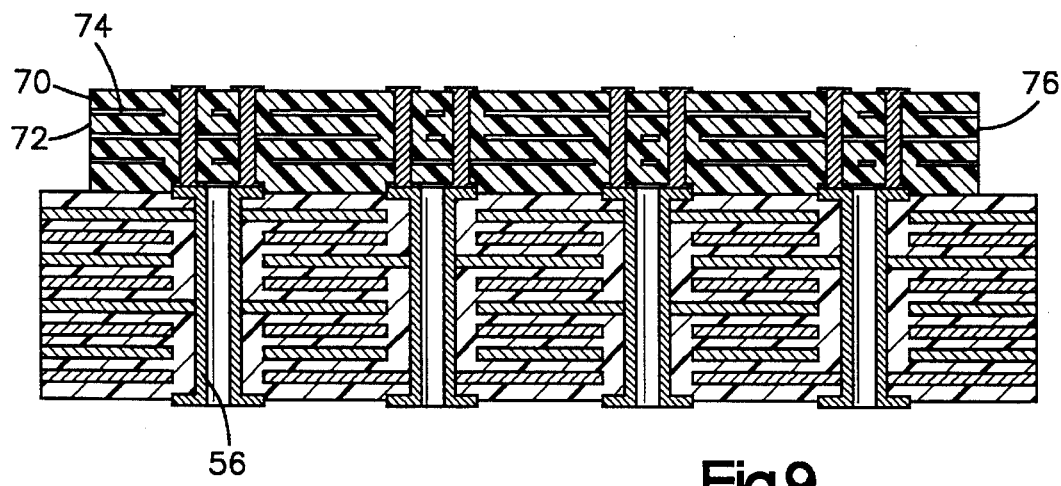
FIG. 9 is a sectional view somewhat diagrammatic showing a power/ground assembly having a redistribution layer or core to isolate signal vias in the circuit card from the power ground assembly.

In some cases, a buffer between the circuit board or card 12 and power ground assembly 30 may be required to prevent shorting of signal vias in the circuit board or card 12 with power/ground connections in the power/ground assembly 30. This can be done by providing a redistribution core 70 interposed between the circuit board or card 12 and the power/ground assembly 30 as shown in FIG. 9. This redistribution core is conventional in structure in that it is comprised of a dielectric material 72 which is preferably silica-filled polytetrafluoroethylene and which has laminated therein copper sheets (power planes 74, ground planes 76). Power and ground vias 78 formed therein to connect the top surface 58 of the power/ground assembly 30 to the power and ground vias 78 of the circuit board or card. The power planes and ground planes 74, 76 and the dielectric material 72 are selected such that the coefficient of thermal expansion of the redistribution core 70 closely matches that of both the card or board 12 and the power/ground assembly 30. This can be easily accomplished by using the same thicknesses and material as are used for the circuit board or card 12. As indicated above, this core 70 provides a buffer between the board or card 12 and power/ground assembly 30 in areas where signals exit the bottom of the circuit board or card to prevent unintentional shortening of any vias connected to signal planes. That is, the redistribution core has no vias in areas where signal vias exit the card or board (when through vias are used for signals), such that no interconnection can occur between the signal vias of the card or board and the power or ground pads on the power/ground assembly. The redistribution core 70 can be bonded to the pads 62 of the power/ground assembly by means of transient liquid phase bonding as disclosed in U.S. Pat. No. 5,280,414 or by other conventional means.

The circuit board or card 12 is bonded to top surface metal pads 82 of the redistribution core 70 again by metallurgical bonding or other means to form the structure shown in FIG. 10.

What is claimed is:

1. A laminated electronic packaging structure comprising a circuit board and a power/ground assembly:

(A) said circuit board being formed of alternating layers of electrical insulating material and conducting material forming voltage planes and signal planes, and having a component mounting face defined by the surface of one of the layers of insulating material and having voltage pads and ground pads formed thereon and connecting with said voltage planes and said ground planes respectively;

(B) said power/ground assembly being formed of alternating layers of:
  (i) an organic electrically-insulating material,
  (ii) at least a first layer of electrically-conducting material forming a first voltage plane,
  (iii) at least a second layer of electrically-conducting material forming a second voltage plane, and
  (iv) at least one layer of a structural material being free of electrical connections and including a component having a coefficient of thermal expansion (CTE) of less than about 17 ppm/C°.

(C) said power/ground assembly having;
  (i) a power input face defined by the surface of one of the layers of organic insulating material and having formed thereon power connection sites connected to said power pads on said circuit board and ground connection sites connected to said ground pads on said circuit board;
  (ii) a first plurality of electrical conductors extending from at least one of the layers of conducting material of said power/ground assembly to said ground connection sites of said power input face of said power/ground assembly;
  (iii) a second plurality of electrical conductors extending from at least a second layer of said conducting material of said power/ground assembly to said power connection sites of said power input face of said power/ground assembly;
  (iv) at least one of said layers of electrically-conducting material and at least one of said layers of said structural material having openings therethrough through which at least some of said electrical conductors extend free of contact therewith;

(D) the layers defining said power/supply assembly being selected in size and material such that the overall coefficient of thermal expansion of said power/supply assembly is substantially the same as the value of the coefficient of thermal expansion of said circuit board.

2. The structure as defined in claim 1 wherein said at least one component has a CTE of less than about 7 ppm/°C.

3. The structure as defined in claim 1 wherein said at least one component has a CTE of no greater than 1 ppm/°C.

4. The structure as defined in claim 1 wherein said at least one component is a nickel-iron alloy.

5. The structure as defined in claim 1 wherein said organic electrically insulating material is polytetrafluoroethylene.

6. The structure of claim 5 wherein the polytetrafluoroethylene is a filled polytetrafluoroethylene.

7. The structure as defined in claim 1 wherein structural material is copper clad nickel/iron alloy.

8. The structure as defined in claim 1 wherein said circuit board and said power/ground structure are formed as discrete components joined physically and electrically.

9. The structure as defined in claim 8 wherein said circuit board includes voltage vias connected to said voltage planes, and said first plurality of electrical conductors are physically and electrically connected to said voltage vias.

10. The invention as defined in claim 9, wherein said electrical and physical interconnection is formed by transient liquid phase bonding.

11. The invention as defined in claim 1, wherein said circuit board power/ground assembly are formed as a unitary structure.

12. The structure as defined in claim 1 wherein a redistribution core of material is interposed as a buffer between the power/ground assembly and the circuit board, and having power planes and ground planes and vias therein.

* * * * *

UNITED STATES PATENT AND TRADEMARK OFFICE
CERTIFICATE OF CORRECTION

PATENT NO.  : 5,574,630
DATED       : November 12, 1996
INVENTOR(S) : Kresge, et al.

It is certified that error appears in the above-indentified patent and that said Letters Patent is hereby corrected as shown below:

Col. 11, ln. 3: Please change "power/supply" to --power/ground--

Col. 11, ln. 5: Please change "power/supply" to --power/ground--

Col. 12, ln. 12: After "circuit board", please insert --and said--

Signed and Sealed this

Eighteenth Day of February, 1997

Attest:

BRUCE LEHMAN

*Attesting Officer*  *Commissioner of Patents and Trademarks*